United States Patent
Chen et al.

(10) Patent No.: US 10,707,673 B2
(45) Date of Patent: Jul. 7, 2020

(54) PROTECTION CIRCUIT FOR OSCILLOSCOPE MEASUREMENT CHANNEL

(71) Applicant: FORD GLOBAL TECHNOLOGIES, LLC, Dearborn, MI (US)

(72) Inventors: Chingchi Chen, Ann Arbor, MI (US); Richard William Kautz, Rochester, MI (US); Krishna Prasad Bhat, Belleville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 367 days.

(21) Appl. No.: 15/469,039

(22) Filed: Mar. 24, 2017

(65) Prior Publication Data

US 2018/0278043 A1     Sep. 27, 2018

(51) Int. Cl.
| H02H 3/20 | (2006.01) |
| G01R 1/36 | (2006.01) |
| H01H 3/02 | (2006.01) |
| G01R 13/02 | (2006.01) |
| H02H 3/02 | (2006.01) |

(52) U.S. Cl.
CPC ............... *H02H 3/20* (2013.01); *G01R 1/36* (2013.01); *H02H 3/021* (2013.01); *G01R 13/0218* (2013.01)

(58) Field of Classification Search
CPC ................. H02H 3/021; H02H 3/20

USPC .......................................................... 361/56
See application file for complete search history.

(56) References Cited

U.S. PATENT DOCUMENTS

| 3,750,015 | A | * | 7/1973 | Sheker | G01R 19/16557 324/149 |
| 4,437,133 | A | | 3/1984 | Rueckert | |
| 6,373,260 | B1 | * | 4/2002 | Weller | G01R 1/067 324/603 |
| 6,970,337 | B2 | * | 11/2005 | Strahm | H02H 9/025 361/58 |
| 8,902,557 | B2 | | 12/2014 | Benner, Jr. | |
| 9,167,077 | B2 | | 10/2015 | Senba | |
| 2010/0277839 | A1 | * | 11/2010 | Nicholson | G01R 1/36 361/54 |
| 2013/0293992 | A1 | * | 11/2013 | Duvvury | H02H 9/044 361/56 |
| 2017/0254842 | A1 | * | 9/2017 | Bahl | G01R 15/04 |

* cited by examiner

*Primary Examiner* — Kevin J Comber
(74) *Attorney, Agent, or Firm* — David Kelley; Brooks Kushman, P.C.

(57) ABSTRACT

A system includes a surge protection circuit electrically connected via a signal transmission line between a source and an oscilloscope, and including a diode configured to be reverse biased, responsive to a voltage of the source being less than a threshold, to decouple an impedance of the circuit from the transmission line and forward biased, responsive to the voltage being greater than the threshold, to couple the impedance to absorb excess energy of the voltage.

7 Claims, 2 Drawing Sheets

US 10,707,673 B2

PROTECTION CIRCUIT FOR OSCILLOSCOPE MEASUREMENT CHANNEL

TECHNICAL FIELD

The present disclosure relates to systems and methods for protecting a measurement channel of an oscilloscope.

BACKGROUND

A digital oscilloscope is a powerful engineering tool for performing digital signal processing and waveform analysis. The oscilloscope may include an analog-to-digital converter, a display, a plurality of user controls, and a processor for performing computations related to a variety of measurements.

The oscilloscope may be computer-based, thus, allowing instrument functionality in a software environment. An oscilloscope, accordingly, may be used not only for general measurements, but also for custom measurements, and even as a spectrum analyzer, frequency counter, ultrasonic receiver, or another measuring instrument.

SUMMARY

A system includes a surge protection circuit electrically connected via a signal transmission line between a source and an oscilloscope, and including a diode configured to be: reverse biased, responsive to a voltage of the source being less than a threshold, to decouple an impedance of the circuit from the transmission line and forward biased, responsive to the voltage being greater than the threshold, to couple the impedance to absorb excess energy of the voltage.

A method includes decoupling, from a transmission line that electrically connects a source and an oscilloscope, an impedance of a surge protection circuit by reverse biasing a diode of the circuit responsive to a voltage of the source being less than a threshold, and coupling the impedance to the line to absorb excess energy of the voltage by forward biasing the diode responsive to the voltage being greater than the threshold.

An oscilloscope includes an input channel connected, at a first end, to an analog-to-digital converter and connected, at a second end, to a surge protection circuit including a pair of diodes, each diode biased by a corresponding power source such that the diode is forward biased and directs energy to an energy absorbing element responsive to a voltage of a signal generated by a signal source being greater than a voltage of the corresponding power source.

DETAILED DESCRIPTION

Figure 1:
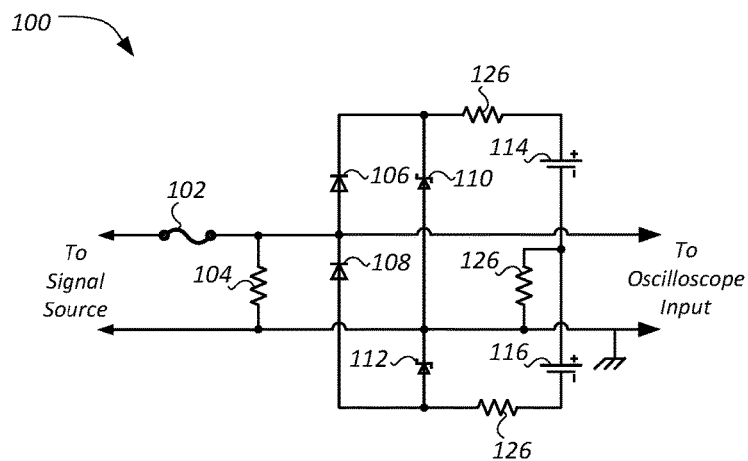
FIG. 1 is a block diagram illustrating an example circuit diagram for protecting an input channel of an oscilloscope.

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Power electronics testing and other projects may necessitate the use of instruments configured to measure high frequency and/or high bandwidth signals. Bandwidth describes a frequency range of an input signal that may pass through the analog front end with a minimal amplitude loss—from the tip of the probe or test fixture to the input of the analog-to-digital converter of the oscilloscope. Bandwidth may be defined as a frequency f at which a sinusoidal input signal is attenuated to 70.7 percent of its original amplitude, also known as the −3 dB point. The signals composed of high-frequency content may include sharp edges or other features of interest to the oscilloscope user. As one example, a 10 MHz square wave is composed of a 10 MHz sine wave and an infinite number of its harmonics. To accurately capture a shape of this signal, the bandwidth of the oscilloscope must be large enough to capture several of these harmonics.

General use measurement equipment may not be able to accommodate measurement of signals having one or both a high magnitude and a large high frequency content without risking exposing the equipment components to currents and voltages that exceed their specifications. To observe and/or analyze an input signal having both a high current/voltage magnitude, such as, but not limited to, between 20 amperes (A) and 10 kA, and a high frequency profile, such as frequencies greater than 50 megahertz (MHz), one or more current shunt resistors may be used with the oscilloscope signal circuit. A current shunt resistor may define a low impedance resistor having minimal effect on the circuit and producing a relatively small parasitic inductance, thus permitting measurements of current signal profile having higher bandwidth, or frequency range.

An input terminal, or input channel, of a typical oscilloscope may be configured to receive a signal transmission cable. In one example, the transmission cable, also referred to as transmission line, may define a coaxial cable including a probe at a first end and a radio frequency connector, e.g., a connector including a pair of bayonet lugs, at a second end. In some examples, the probe may comprise a probe head configured to receive a spring or rigid probe tip and a blade or offset ground tip. Attaching (or otherwise positioning) the probe tip in proximity with a signal source may enable the output signal of the source to be observed, measured, and analyzed using the oscilloscope. In some other examples, the probe may comprise a clamp configured to receive one or more coils of a wire in which the signal is being measured.

The probe may define, for example, a passive probe including one or more passive circuit components and having relatively low bandwidth. In another example, the probe may define a divider or attenuating probe including integrated resistor and capacitor connected in parallel. In still another example, the probe may be an active probe defining a low input capacitance necessary for measuring high frequency signals or isolating the measurement from a particular ground reference. In yet another example, the probe may comprise one of a differential probe used with a differential or floating input of the oscilloscope, a high voltage active probe for measuring high direct current (DC) offsets or large voltage ranges, or a current probe including at least one of a Hall effect sensor and a current transformer and configured to convert the detected current flow to voltage that may be viewed and measured using the oscilloscope. Other probe types and configurations, as well as, probes defining additional or wholly divergent capabilities are also contemplated.

The connector at the second end of the transmission cable may be configured to connect to at least one input channel of the oscilloscope. The effect of the probe or probe components on the signal may, accordingly, distort the signal received at the oscilloscope. The input resistance, capacitance, bandwidth, and other specifications and operating characteristics of a given probe may affect the signal the probe is transmitting to the oscilloscope.

As one example, the impedance of the circuit and the input impedance of the oscilloscope together may define a low-pass filter. For very low frequencies, the capacitor may act as an open circuit, thereby, having little or no effect on the measurement. For high frequencies, the capacitor's impedance may become significant and may load down the voltage seen by the oscilloscope, such as may be observed in the frequency domain. If the input is a sine wave, the amplitude may decrease with increasing frequency and the phase may be shifted. The loading may also affect the oscilloscope's response to a step change in voltage. The loading due to the input impedance of the scope (and the probe capacitance) may be one or more of resistive loading and capacitive loading. The resistive loading may be due to the input resistance of the scope, while the capacitive loading may be due to the probe capacitance combined with the scope input capacitance.

The resistive loading may be illustrated using voltage divider circuit, such that the voltage delivered to the scope input, $V_{IN}$ may include a source voltage, $V_S$ having a reduced amplitude. As an example, the input voltage over time, t for a given maximum voltage, $V_{MAX}$ may be given as shown in Equation (1):

$$V_{IN}(t) = V_{MAX} \frac{R_{IN}}{R_{IN} + R_S} \quad (1)$$

The effect of capacitive loading may be more complex and may result in an exponential response in the input voltage, $V_{IN}$. The input voltage, $V_{IN}$ may be a product of a voltage step having a value that increases from zero volts to the maximum voltage, $V_{MAX}$ over time, t and may be given as shown in Equation (2).

$$V_{IN}(t) = V_{MAX}(1 - e^{-t/(R_S C_T)}), \quad (2)$$

where $R_S C_T$ defines a time constant, $\tau$.

The resistive loading may change the size of the voltage step, but does not change the waveform shape. Capacitive loading may slow down the rise time of the step but may eventually settle out to a same final value as an ideal frequency response. The bandwidth may be inversely proportional to rise time of a system, such that a decrease in the bandwidth of the measuring instrument may cause a corresponding increase in the rise and fall times of pulse inputs to the instrument.

The output resistance (drive capability) of a digital circuit may vary with the output voltage, thus, causing a variation in the effect of capacitive loading. Nevertheless, the load capacitance may slow down the rise time of the signal while resistive loading may affect the output amplitude. Increased rise time in a digital circuit may, thereby, cause an increased delay before the signal reaches the next logic gate. This may be due to increased signal rise time to the logic threshold, causing the next gate to switch later. Therefore, where the input impedance of a given oscilloscope may be large enough to prevent or minimize effects of resistive loading, a given circuit may, nevertheless, be vulnerable to capacitive loading due to an increased signal rise time introduced by the probe.

The additional capacitance of the probe may further cause the resonance frequency of an LC circuit to change. In one example, additional capacitance introduced by the probe may change the resonance frequency of the LC circuit to 0.93 times its original frequency and may, thus, prevent a correct operation of that circuit while the measurement is being taken with the probe.

Active probes may be ideal in cases where extremely low capacitance is required for high-frequency measurements or a measurement needs isolation from a given ground reference. The integrated active amplifier of the active probe may enable the probe to have very little capacitance on its input, such as a value less than or equal to 2 picofarads (pF). Furthermore, the output impedance of the amplifier may be matched to an impedance of the oscilloscope input, thereby, minimizing any additional capacitive loading effects. The low capacitance of the active probe may result in high input impedance at high frequencies.

The signal transmission cable 110 may have a predefined impedance, such as, but not limited to, 50Ω. The use of current shunts may require the use of 50-Ω transmission cable, which may be connected either directly to the oscilloscope signal input terminal, or via an input terminal external to the oscilloscope that is then connected to the oscilloscope's 1 MΩ input terminal. This setup brings a risk, where an excessive current surge, and/or blow-out of current shunt can cause an excessive voltage surge on the measurement line and/or damage to the measuring equipment.

FIG. 1 illustrates an example protection circuit 100 configured to protect an oscilloscope, or another measuring instrument, from electrical damage that may result due to transmission line voltage being greater than a predefined threshold. The circuit 100 includes a fuse $S_1$ 102. As one example, the fuse $S_1$ 102 may be a disposable fuse. As another example, the fuse $S_1$ 102 may be a resettable fuse.

The circuit 100 may include a resistor $R_1$ 104 connected in parallel between the signal source and the oscilloscope. The resistor $R_1$ 104 may be an impedance matching resistor configured to regulate transmission line impedance to match an impedance value at the input terminal of the oscilloscope.

The circuit 100 further includes diodes $D_1$ 106 and $D_2$ 108, each of the diodes configured to couple and decouple a corresponding one of a first and second energy absorbing elements $Z_1$, $Z_2$, 110, 112, respectively, such that the corresponding impedances of the elements $Z_1$, $Z_2$, 110, 112 become perceptible to the transmission line and/or the measuring equipment. The diodes $D_1$, $D_2$ 106, 108 may each be biased by respective power supplies $V_1$ 114 and $V_2$ 116. The values of the power supplies $V_1$ and $V_2$ 114, 116 may be defined such that the corresponding diodes $D_1$, $D_2$ 106, 108 are reverse biased in response to line voltage $V_{line}$ being less than a voltage value of a corresponding one of the power supplies $V_1$ and $V_2$ 114, 116 and are forward biased in response to line voltage $V_{line}$ being greater than voltage value of the corresponding one of the power supplies $V_1$ and $V_2$ 114, 116.

As one example, the diode $D_1$ 106 may be reverse biased in response to line voltage $V_{line}$ being less than the value of the power supply $V_1$ 114. When in reverse biased state, the diode $D_1$ 106 may, thereby, decouple an impedance of the energy absorbing element $Z_1$ 110 and other elements of the circuit 100 from the transmission line.

Furthermore, the diode $D_1$ 106 may be forward biased in response to line voltage $V_{line}$ being greater than the value of the power supply $V_1$ 114. When in a forward biased state, the diode $D_1$ 106 may direct energy to the energy absorbing element $Z_1$ 110 in response to line voltage $V_{line}$ being greater than the clamp voltage $V_{clamp+}$ of the energy absorbing element $Z_1$ 110. The diode $D_1$ 106 may, thereby, couple an impedance of the energy absorbing element $Z_1$ 110 and other elements of the circuit 100 to the transmission line. The energy surge may, accordingly, pass through the energy absorbing element $Z_1$ 110, thereby clamping, e.g., limiting, the line voltage $V_{line}$ at a value approximately equal to the clamp voltage $V_{clamp+}$ of the energy absorbing element $Z_1$ 110.

The circuit 100 may be element symmetric, such that the diode $D_2$ 108 may be configured to operate with respect to the negative voltage values in a similar manner to the operation of the diode $D_1$ 106 with respect to the positive voltage values. For example, the diode $D_2$ 108 may be reverse biased in response to negative line voltage $V_{line}$ being less than the value of the power supply $V_2$ 116. When in a reverse biased state, the diode $D_2$ 108 may decouple an impedance of the energy absorbing element $Z_2$ 112 and other elements of the circuit 100 from the transmission line.

Furthermore, the diode $D_2$ 108 may be forward biased in response to negative line voltage $V_{line}$ being greater than the value of the power supply $V_2$ 116. When in a forward biased state, the diode $D_2$ 108 may direct energy to the energy absorbing element $Z_2$ 112 in response to line voltage $V_{line}$ being greater than the clamp voltage $V_{clamp-}$ of the energy absorbing element $Z_2$ 112. The diode $D_2$ 108 may couple an impedance of the energy absorbing element $Z_2$ 112 and other elements of the circuit 100 to the transmission line. The energy surge may, accordingly, pass through the energy absorbing element $Z_2$ 112, thereby clamping, e.g., limiting, the line voltage $V_{line}$ at a value approximately equal to the clamp voltage $V_{clamp-}$ of the energy absorbing element $Z_2$ 112.

The energy absorbing elements $Z_1$ and $Z_2$, 110, 112 may be Zener diodes defining a breakdown voltage, or the amount of reverse voltage which the diode receives, before it breaks down and begins conducting reverse current across its junctions. Thus, the energy absorbing elements $Z_1$ and $Z_2$, 110, 112 defining Zener diodes may conduct current in a reverse biased direction across its terminals in response line voltage line voltage $V_{line}$ being greater than the corresponding breakdown voltages of each of the energy absorbing elements $Z_1$, $Z_2$ 110, 112. Prior to the breakdown voltage of the energy absorbing elements $Z_1$, $Z_2$ 110, 112 being exceeded, the energy absorbing elements $Z_1$, $Z_2$ 110, 112 may be configured to hold voltage across their terminals to the value of the line voltage $V_{line}$.

A plurality of resistors $R_2$, $R_3$, $R_4$ may be configured to act as low frequency decoupling elements to decouple the power supplies $V_1$, $V_2$ 110, 112 from high frequency transmission line.

The circuit 100 may be configured to provide protection against voltage spikes as high as 1000 VDC, while maintaining oscilloscope operating requirements, such as, but not limited to, transmission line termination impedance of 50Ω, output voltage having a value significantly less than a maximum voltage specified for the equipment, e.g., output voltage ~±20 V for equipment specified voltage±325 V, operate at a bandwidth (50 MHz) greater than current shunt (10-20 MHz), minimal intrusion effect on transmission line (<1% error), and prevent or minimize electrical arcing between output of the signal source and the input terminal of the oscilloscope during fault interruption.

As an example, the protection circuit 100 may be implemented on a four-layer printed circuit board (PCB) (not shown). The top layer of PCB may be dedicated mainly for high frequency measurement transmission line, a transmission fuse element and to ensure impedance matching between impedance of the transmission line and impedance at the input to the oscilloscope. The PCB implementation of the protection circuit may be configured to include one or more traces having minimal width sufficient to support serving as a transmission line and ensure effective 50-Ω transmission line impedance compatible with the 50-Ω impedance at the input to the oscilloscope.

A bottom layer of the PCB may include a plurality of protection components such as, but not limited to, one or more series diodes, suppression diodes, and so on. The protection components may be configured to absorb excess energy to avoid damage to the equipment. In some examples, a signal ground line may define a return path for current. Power ground may be left unused to reduce impact of possible ground currents. Physical presence of power ground is imperative due to 4-layer PCB design.

Figures 2A, 2B:
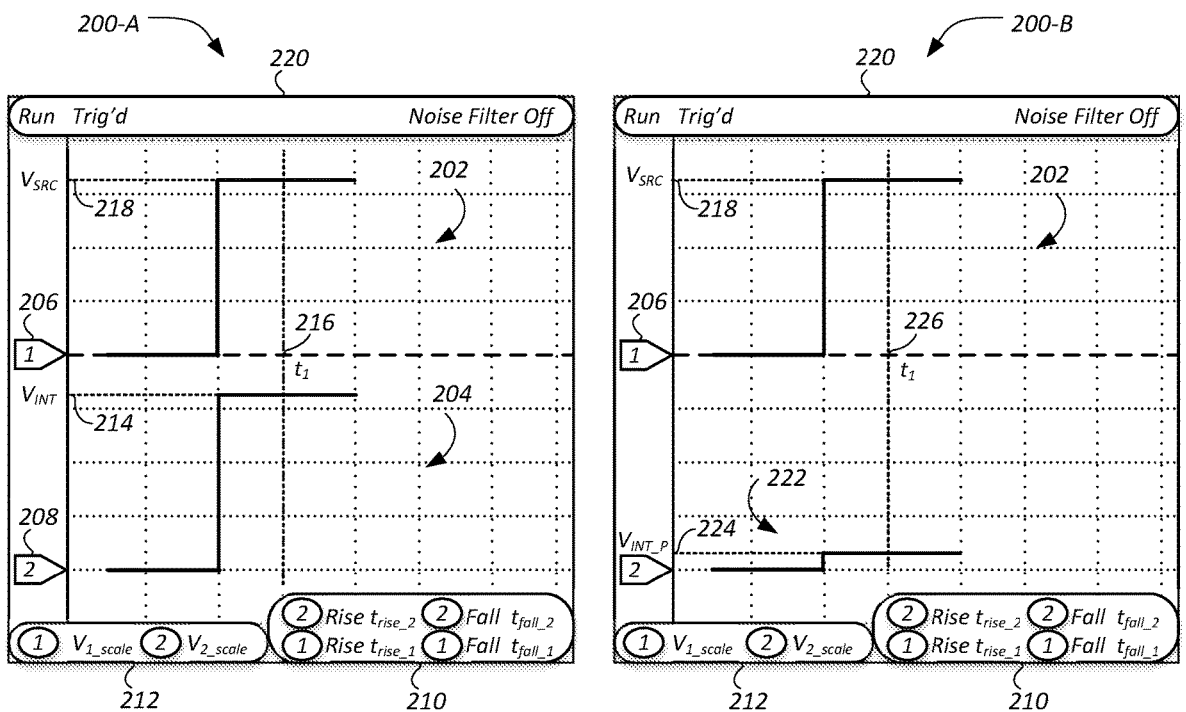
FIGS. 2A and 2B are graphs illustrating voltage signal waveforms.

FIGS. 2A and 2B illustrate example diagrams 200-A and 200-B of a source signal 202, as detected, for example, by positioning a first probe in proximity with a signal source, and an input terminal signal 204, as detected, for example, by positioning a second probe in proximity with an input terminal of an oscilloscope, or another measuring instrument, connected with the same signal source. The input terminal signal 204, i.e., the signal received by the measuring instrument connected to the signal source from which the signal 202 originated, may therefore, be indicative of an effect the source signal 202 may have on the instrument receiving the signal 202.

The profiles of the signals 202, 204 may be displayed, for example, on first and second input channels 206, 208, respectively. The signals 202, 204 may be voltage signals, each having same or different rise and fall times 210 and being shown according to same or different signal display scale 212, e.g., a predefined display scale selected by the user. One or more additional settings 220 may be applied to view, display, or analyze the signals 202, 204.

As one example, the measuring instrument whose input terminal signal 204 is shown in FIG. 2A may be the instrument not equipped with the protection circuit, such as the example circuit 100 described in reference to FIG. 1. An input terminal voltage $V_{INT}$ 214 detected at time $t_1$ 216 at the input terminal of the unprotected measuring instrument may be indicative of a source voltage $V_{SRC}$ 218 detected at the time $t_1$ 216 at the signal source. More specifically, given that the corresponding signal display scales 212 are the same for both signals 202, 204, e.g., $V_{1\_scale}=V_{2\_scale}$, the input terminal voltage $V_{INT}$ 214 may be approximately equal to the source voltage $V_{SRC}$ 218, as shown in FIG. 2A. Where the source voltage $V_{SRC}$ 218 is greater than a maximum operating voltage of the instrument, the operation of the input terminal and/or of the measuring instrument itself may be negatively affected.

As another example, the measuring instrument whose input terminal signal 222 is shown in FIG. 2B may include a protection circuit, such as the example circuit 100 described in reference to FIG. 1. A protected input terminal voltage $V_{INT\_P}$ 224 detected at time $t_1$ 226 at the input terminal of the protected measuring instrument may be indicative of a value much less than the source voltage $V_{SRC}$ 218 detected at the time $t_1$ 226 at the signal source.

More specifically, the instrument may be equipped with the protection circuit 100 that includes the diodes 106, 108 biased by the voltage supplies 114, 116, respectively, and further includes the energy absorbing elements $Z_1$, $Z_2$ 110, 112 having a predefined breakdown voltage $V_{BRK}$. The protection circuit 100 may be configured to enable the diodes 106, 108 to conduct (or become forward-biased) responsive to voltage at the input to the protection circuit being greater than voltage of the corresponding one of the voltage supplies 114, 116.

The protection circuit 100 may, thereby, couple the impedance of the circuit 100 to the transmission line leading to the input terminal of the measuring instrument. The protection circuit 100 may, accordingly, cause the corresponding one of the energy absorbing elements $Z_1$, $Z_2$ 110, 112 to absorb, redirect, and/or dissipate energy in excess of the predefined breakdown voltage $V_{BRK}$ of that element. The protected input terminal voltage $V_{INT\_P}$ 224 of the measuring instrument that includes the protection circuit 100 may, therefore, be approximately equal to the predefined breakdown voltage $V_{BRK}$ of one of the elements $Z_1$, $Z_2$ 110, 112.

Figure 3:
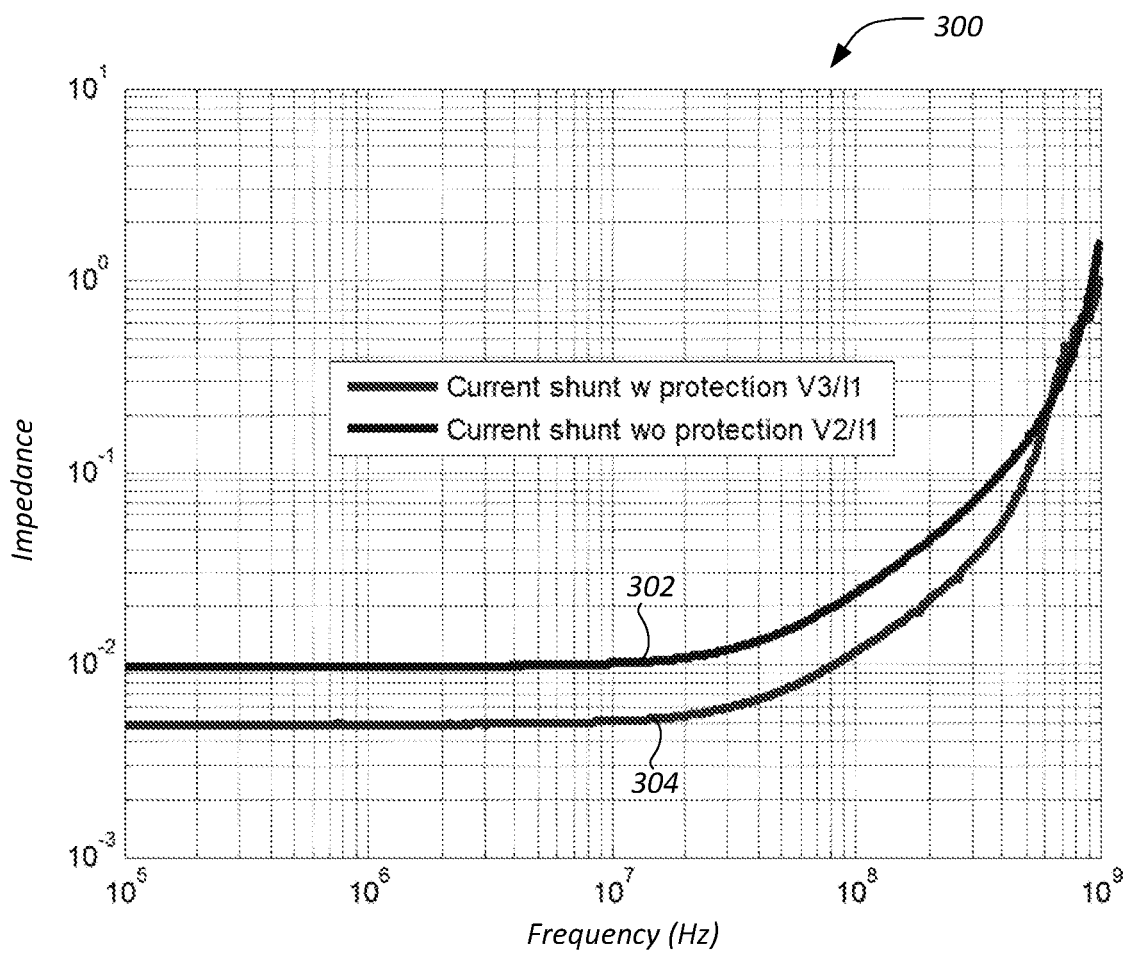
FIG. 3 is a graph illustrating transmission line impedance waveforms.

FIG. 3 illustrates an example graph 300 illustrating a change in transmission line impedance, shown along vertical axis, with respect to a change in frequency of the signal, shown along horizontal axis and measured in hertz (Hz). The transmission line impedance with respect to frequency may be detected, for example, at the input terminal of the measuring instrument electrically connected to the signal source that generates a source signal of varying frequency.

A first curve 302 may be indicative of a change in impedance with respect to frequency at the input terminal of the measuring instrument that does not include the protection circuit 100. A second curve 304 may be indicative of a change in impedance with respect to the frequency at the input terminal of the measuring instrument that includes the protection circuit 100. As illustrated in FIG. 3, the curves 302, 304 indicate a decrease in a difference between the respective impedance values of each of the curves 302, 304 at a given frequency as the frequency values increase. The curves 302, 304, accordingly, indicate that signals having high frequency content, such as signals including frequencies measured in megahertz (MHz) and gigahertz (GHz), may have approximately the same impedance at the input terminal to the measuring instrument whether those signals have travelled through one or more components of the protection circuit 100 or not.

The processes, methods, or algorithms disclosed herein may be deliverable to or implemented by a processing device, controller, or computer, which may include any existing programmable electronic control unit or dedicated electronic control unit. Similarly, the processes, methods, or algorithms may be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms may also be implemented in a software executable object. Alternatively, the processes, methods, or algorithms may be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A system comprising:
a surge protection circuit electrically connected via a signal transmission line between a source and an oscilloscope, and including
a pair of energy absorbing elements, wherein an anode of one of the energy absorbing elements and a cathode of the other of the energy absorbing elements share a common terminal,
a diode configured to be
reverse biased, responsive to a voltage of the source being less than a threshold, to decouple one of the energy absorbing elements of the circuit from the transmission line, and
forward biased, responsive to the voltage being greater than the threshold, to couple the one of the energy absorbing elements to the transmission line such that current first flows through the diode and then to the one of the energy absorbing elements, and the one of the energy absorbing elements absorbs energy associated with the voltage to limit the voltage to a clamp voltage defined by the one of the energy absorbing elements, and
a voltage supply configured to establish the threshold and reverse bias the diode.

2. The system of claim 1, wherein the one of the energy absorbing elements is in series with the diode.

3. The system of claim 1, wherein the circuit includes a resistor electrically connected across an input terminal to the oscilloscope such that the impedance of the circuit matches an impedance of the input terminal.

4. The system of claim 1, wherein the surge protection circuit further includes a second diode directly connected with the diode and configured to be
- forward biased, responsive to the voltage being less than a second threshold, to decouple the other of the energy absorbing elements of the circuit from the transmission line, and
- reverse biased, responsive to the voltage being greater than the second threshold, to couple the other of the energy absorbing elements to the transmission line such that current first flows through the second diode and then to the other of the energy absorbing elements, and the other of the energy absorbing elements absorbs energy associated with the voltage to limit the voltage to a second clamp voltage defined by the other of the energy absorbing elements.

5. The system of claim 1, wherein the circuit includes a fuse electrically connected along the transmission line between the source and the diode and configured to interrupt signal transfer to the oscilloscope responsive to the voltage of the source being greater than a maximum voltage threshold of the diode that is greater than the threshold.

6. An oscilloscope comprising:
- an input channel connected, at a first end, to an analog-to-digital converter and connected, at a second end, to a surge protection circuit including a pair of connected energy absorbing elements in parallel with a pair of connected diodes, wherein an anode of one of the energy absorbing elements and a cathode of the other of the energy absorbing elements share a common terminal, and wherein one of the diodes is biased by a corresponding power source such that the diode directs energy to the one of the energy absorbing elements responsive to a voltage of a signal generated by a signal source being greater than a voltage of the corresponding power source and does not direct energy to the one of the energy absorbing element responsive to the voltage of the signal generated by the signal source being less than the voltage of the corresponding power source.

7. The oscilloscope of claim 6, wherein the circuit further includes a resistor connected across the channel and configured to match impedance of the circuit to impedance of the channel.

* * * * *